United States Patent [19]

Goodner

[11] Patent Number: 4,621,045
[45] Date of Patent: Nov. 4, 1986

[54] PILLAR VIA PROCESS
[75] Inventor: Willis R. Goodner, Chandler, Ariz.
[73] Assignee: Motorola, Inc., Schaumburg, Ill.
[21] Appl. No.: 740,790
[22] Filed: Jun. 3, 1985
[51] Int. Cl.[4] .............................................. B44C 1/22
[52] U.S. Cl. .................................... 430/311; 430/313; 430/314; 430/316; 430/317; 430/318; 430/323; 430/324; 430/325; 430/330
[58] Field of Search ............... 430/311, 313, 314, 316, 430/317, 318, 323, 324, 325, 330

[56] References Cited
U.S. PATENT DOCUMENTS
4,430,365  2/1984  Schaible et al. ...................... 427/96
4,541,893  9/1985  Knight .................................. 427/89
4,545,852 10/1985  Barton ................................. 156/643

Primary Examiner—John E. Kittle
Assistant Examiner—Patrick J. Ryan
Attorney, Agent, or Firm—Robert M. Handy

[57] ABSTRACT

A method is described for providing a conductive pillar in a via between multiple layers of conductors on planar electronic structures such as integrated circuits while at the same time exposing other large area contact regions such as a bonding pad. A first conductor layer is formed on the device substrate, etched to delineate the bonding pad and the first level interconnects, and covered with a differentially etchable intermediate conductive material which is delineated to form the conductive pillar. A dielectric planarizing layer is applied so as to have a smooth surface contour and a lower thickness above the conductive pillar than over the first level interconnects or the bonding pad. The planarizing dielectric is desirably a negative acting radiation sensitive material such as a polyimide. A mask is used to render the portions of this dielectric planarizing layer above the bonding pad soluble so that it may be dissolved away while leaving the remainder undisturbed. The resulting structure is then blanket etched to remove the smaller thickness of dielectric layer above the top of the pillar. The dielectric surface and pillar surface smoothly join. Another conductive layer is then applied over the surface of the dielectric planarizing layer and in contact with the top of the pillar and patterned in the conventional manner to form the second level interconnects. The resulting structure has a relatively smooth surface topology and little or no step at the pillars.

10 Claims, 23 Drawing Figures

FIG. 1B — PRIOR ART —

PILLAR VIA PROCESS

FIELD OF THE INVENTION

This invention relates in general to electronic devices and, more particularly to planar devices having multiple layers of metallization connected by one or more conductive pillars in vias passing between the layers.

BACKGROUND ART

It is commonplace in electronic art, particularly the semiconductor art to use multiple layers of conductors to interconnect different devices or device regions. For example, power and ground may be distributed on one layer of interconnections while signals are distributed on a different layer or, all the interconnections on a first layer may be aligned in a first direction while the interconnections on a second layer are aligned in a second direction at right angles to the first direction. Other arrangements are also used. Multiple conductor layers permit more compact device and circuit layouts. This is highly desirable.

The various conductors, conductor layers, or interconnections are typically of metal although semiconductors and other conductive materials are also employed. As used herein the word "interconnections, interconnects, metal, metallization, conductor, conductive, or conducting" whether used singly or in combination with the prefix "multi-" or the words "multi-layer" are intended to refer to any conductive material, including, but not limited to metals, semiconductors, semimetals, and intermetallics.

Multi-layer metal arrangements and methods are known in the semiconductor art. The multiple metal layers are separated by one or more dielectric insulating layers except at particular points where conductive vias are provided. It is important that the surfaces of the successive conductor and dielectric layers be as smooth and free from cracks and steps as possible, since such features produce weak points in the overlying layers which adversely affect yield and reliability. Sometimes, the via is merely an opening in the intervening dielectric layer through which the upper metal layer penetrates so that it locally contacts the lower metal layer. In this circumstance the upper metal layer may have to pass over a sharp step at the edge of the via hole. In order to avoid such sharp steps, via holes in the prior art have frequently been outwardly tapered. But, outwardly tapered vias occupy greater surface area and are therefore undesirable for use in VLSI and other very dense or compact structures.

It is preferable to use an approximately straight-sided via hole through the inter-layer dielectric which is filled with a conductive pillar or column whose upper surface joins as smoothly as possible with the upper surface of the dielectric layer and whose sides are approximately vertical. This minimizes the surface discontinuities and surface area. As used herein, the words "pillar" or "column" are intended to be equivalent, and to refer to a conductive region passing between superimposed conductor layers through a via hole having sidewalls which are approximately vertical or which slope inwardly.

A process for forming conductive columns or pillars is described in copending application Ser. No. 717,343 by Hulseweh, entitled "Pillar Via Process", which is incorporated herein by reference. This and other processes for forming such conductive pillars are sensitive to the surface area of the pillar and the surface area of other exposed conductors which must be simultaneously formed. If, for example, the process is adjusted to make the surface of a first pillar (having a first area) locally flush with the surface of the dielectric interlayer, so that the two surfaces smoothly join without a crack or step, then other exposed pillars or conductors having different areas will not be flush and smoothly joined with the dielectric surface but will lie above or below the dielectric surface by different amounts creating a step and/or crack. This is due to the fact that the planarizing action of the dielectric inter-layer is area dependent. This area dependence can create or exaggerate surface steps. The problem is particularly severe when large area exposed conductors, such as bonding pads, and small area exposed pillars must be provided in the same conductor layer.

Accordingly, it is an object of the present invention to provide an improved process for forming conductive pillars or vias in electronic devices, for example, between multiple conductor layers in semiconductor integrated circuits.

It is a further object of the present invention to provide an improved process for forming conductive pillars or vias and exposed contact regions of different areas in the same device.

It is an additional object of the present invention to provide an improved process for forming relatively small area conductive pillars or vias, and relatively large area exposed bonding pads in the same conductor layer.

It is a further object of the present invention to provide an improved process for forming conductive pillars or vias and exposed contact regions of different areas, without an increase in pillar or via area, and without requiring outwardly tapered via holes.

It is an additional object of the present invention to provide an improved process for forming conductive pillars or vias without requiring the use of additional photomasking layers on the device.

SUMMARY OF THE INVENTION

The attainment of the foregoing and other objects and advantages is achieved wherein there is provided a process for forming multi-layer conductor structures, comprising: providing a substrate and applying a first conductor layer to the substrate, wherein the first conductor layer includes a first interconnect region and a first bonding region; forming a conductive pillar on he first interconnect region; coating the substrate, bonding region, and pillar with a photosensitive dielectric planarizing layer having a first thickness over the substrate, a second thickness over the bonding region, and a third thickness over the pillar, wherein the third thickness is less than the first and second thicknesses; removing a first portion of the planarizing layer to expose a central part of the bonding region while leaving substantially undisturbed a second portion of the planarizing layer covering the first interconnect region and the pillar; uniformly etching the planarizing layer to expose the upper surface of the pillar; and applying a second conductive layer over the remaining planarizing layer and in contact with the upper surface of the pillar.

It is desirable that the planarizing layer be formed from a radiation sensitive material and that the removing step comprise exposing the radiation sensitive planarizing layer through a mask so as to render the first portion of the planarizing layer above the central part of the bonding region soluble in developer. It is further desirable that the first forming step comprise applying an intermediate conductive layer on the first conductive layer, then removing a first portion of the intermediate layer to leave a second portion on the interconnect region to form the pillar. It is desirable that the intermediate conductive layer be of a material which is differentially etchable with respect to the first conductor layer.

These and other features of the present invention are further explained in the figures and description which follow.

BRIEF DESCRIPTION OF THE DRAWINGS

FIG. 1B is a simplified cross-section, along a first line, of the device of FIG. 1A;

DETAILED DESCRIPTION OF THE DRAWINGS

Figure 1A:
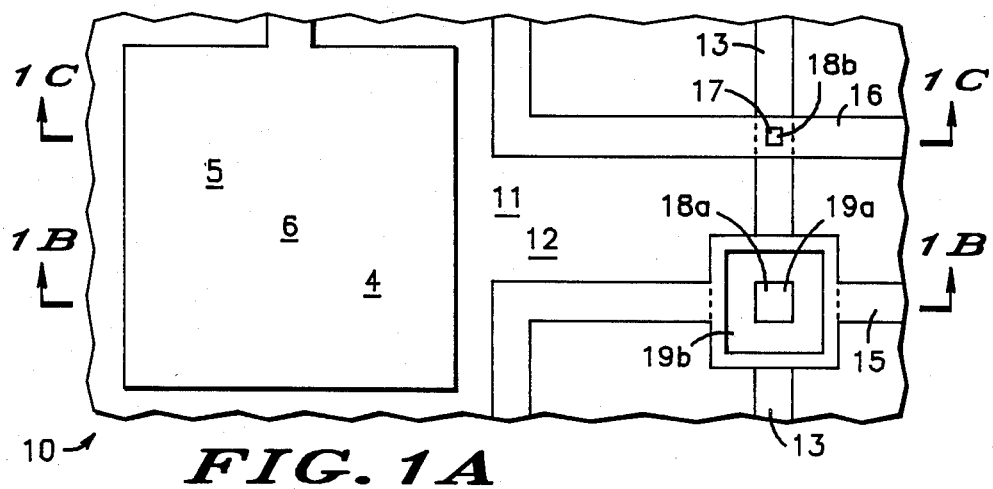
FIG. 1A is a simplified top view in schematic form of a portion of an electronic device employing multiple layers of conductors.
Figure 1C:
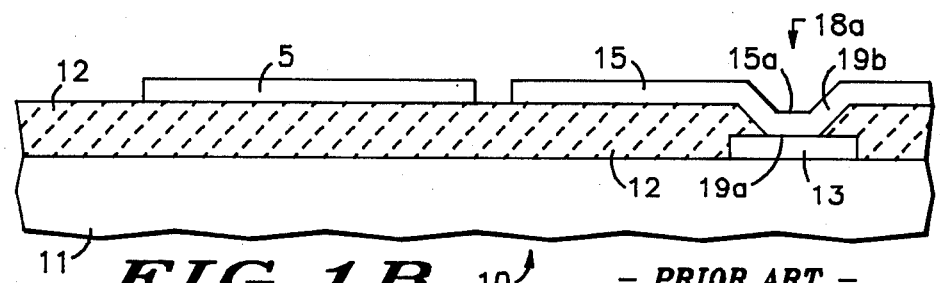
FIG. 1C is a simplified cross-section, along a second line, of the device of FIG. 1A.
Figure 1C:
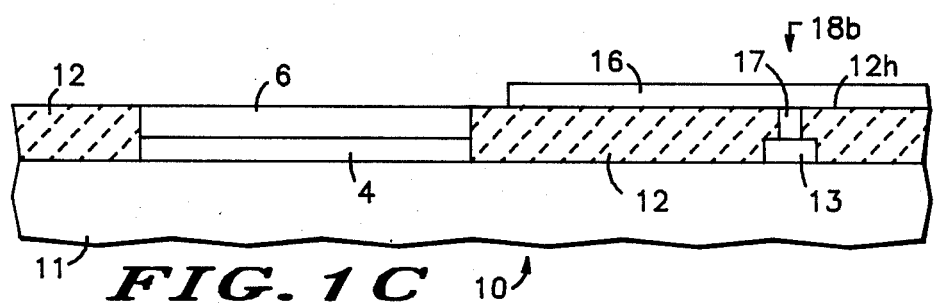

FIG. 1 shows a simplified top view of a Portion of electronic device 10 employing lower conductor layer 4, 13 and upper conductor layer 5, 15–16 separated by insulating dielectric 12. FIGS. 1B–C are simplified cross-sections along different lines through FIG. 1A and showing different embodiments. Substrate 11 has thereon lower conductor 13 running vertically in FIG. 1A. Substrate 11 also has bonding pad 4, 6, where portion 4 is formed at the same time as conductor 13. Lower conductor 13 and upper conductors 15–16 are separated, except at vias 18a–b by dielectric layer 12. For clarity, dielectric layer 12 is transparent in FIG. 1A and cross-hatched in FIGS. 1B–C.

FIG. 1B shows a cross-section through via 18a connecting lower conductor 13 and upper conductor 15, and FIG. 1C shows a cross-section through via 18b connecting lower conductor layer 13 and upper conductor layer 16. Via 18a is of the type found in the prior art wherein opening 19a, having outward sloping or tapered sidewalls 19b, is provided in dielectric layer 12 so that portion 15a of upper conductor 15 may penetrate through dielectric layer 12 and directly contact lower conductor 13. Tapered sidewalls 19b reduce the abruptness of the step over which upper conductor 15 must pass. FIG. 1B also illustrates the situation where bonding pad 5 is formed simultaneously with conductor 15 and located on top of dielectric layer 12.

FIG. 1C illustrates the structure produced by the method of the present invention wherein lower conductor 13 and upper conductor 16 are connected by conductive pillar or column 17 passing through via 18b in layer 12, and having substantially vertical or inward sloping sidewalls. The upper surface of pillar 17 smoothly joins upper surface 12h of dielectric 12. The joining of the two surfaces is illustrated in greater detail in FIGS. 2I and 5. FIG. 1C also illustrates the situation where bonding pad 4 is formed simultaneously with first conductor 13, and includes optional portion 6 formed at the same time as column 17. Upper conductor 16 of FIG. 1C performs the same function as upper conductors 29a and 39a of FIGS. 2I–J, FIG. 3B, and FIGS. 4D–F.

Figure 2A:
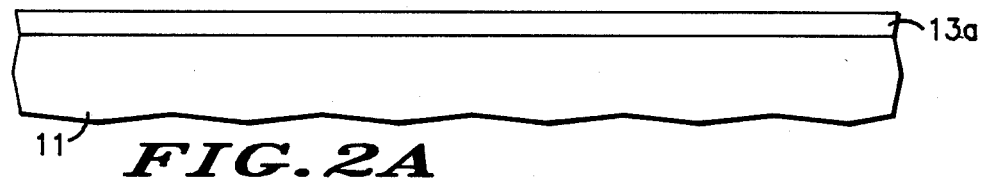
FIGS. 2A–J are cross-sections in simplified and schematic form, analogous to FIG. 1C, showing greater detail, and during various stages of fabrication according to a preferred embodiment of the present invention.
Figure 2B:
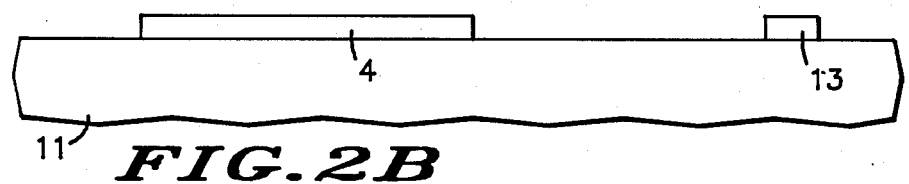
Figure 2C:
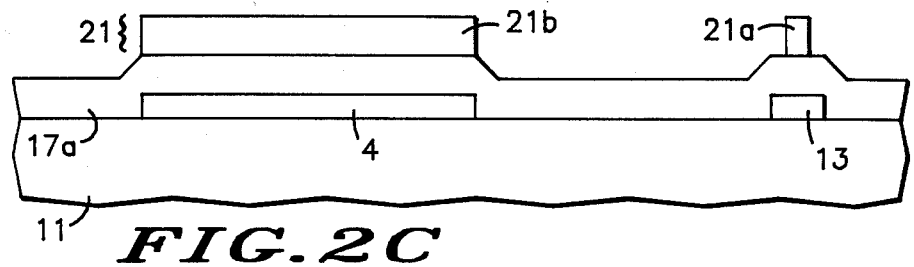
Figure 2D:
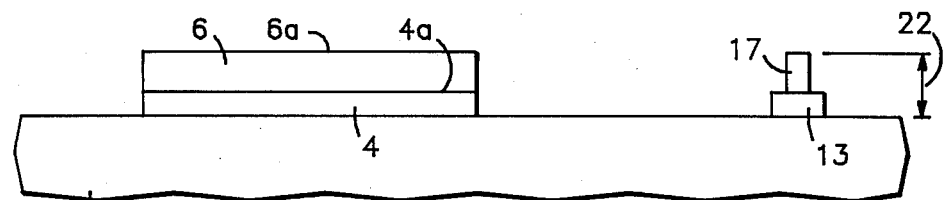

FIGS. 2A–J show, in simplified schematic form, cross-sections similar to that in FIG. 1C, but in greater detail and during different stages of fabrication according to the present invention. In FIG. 2A, substrate 11, which may be any planar electronic structure using multi-layer interconnections, has thereon lower first conductor or metal-layer 13a. First metal layer 13a is patterned and etched using conventional techniques to provide lower conductor 13 and bonding pad 4 (FIG 2B). In FIG. 2C, the exposed portions of substrate 11, lower conductor 13 and bonding pad 4 are covered by intermediate conductor layer 17a and masking layer 21. Masking layer 21 is conveniently of photoresist and is patterned using means well known in the art to provide a first pattern 21a over interconnect 13 in the location desired for a conductive pillar and second pattern 21b over bonding pad 4. Using patterns 21a–b of layer 21 as a mask, the exposed portions of layer 17a are removed so as to provide conductive pillar 17 having height 22 above substrate 11, and portion 6 on bonding pad 4 (FIG. 2D). Depending upon the etching method used, pillar 17 will have inwardly sloping or approximately vertical sidewalls. For example, isotropic (e.g. wet chemical) etching can be used to produce inwardly sloping sidewalls and anisotropic (e.g. ion milling) etching can be used to produce approximately vertical sidewalls. Conductor portion 6 may be omitted. The subsequent process steps are the same with or without portion 6. If portion 6 is omitted bonding will take place on surface 4a rather than surface 6a.

Figure 2E:
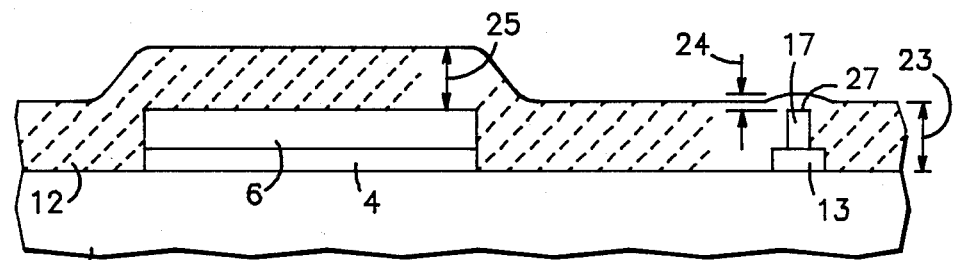

The structure of FIG. 2D is then covered in FIG. 2E by dielectric layer 12. Dielectric layer 12 serves a multiplicity of purposes and must be chosen to have good dielectric insulating properties and good planarizing properties. Dielectric layer 12 has first thickness 24 over pillar 17, second thickness 25 over bonding pad 4, 6 and third thickness 23 over the remaining portions of substrate 11. A property of good planarizing materials is that they provide a smoothly contoured surface having no sharp steps or cracks despite the presence of sharp steps or cracks in the underlying structure. A further property of planarizing materials is that thickness 24 over small area column 17 is significantly less than thicknesses 23 and 25 over larger area bonding pad 4, 6 and substrate 11.

Figure 2G:
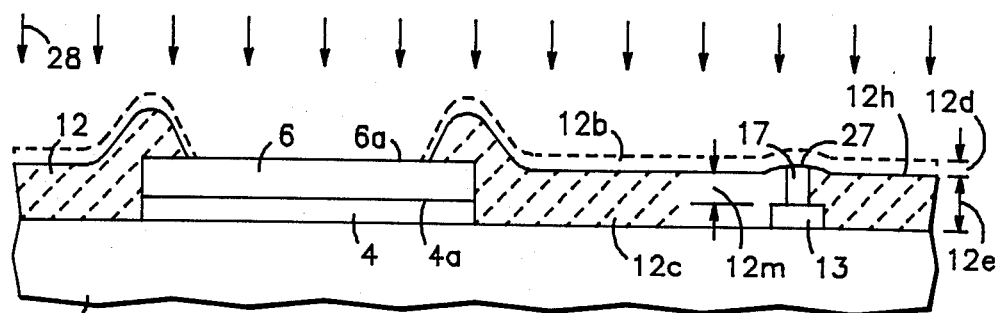
Figure 3A:
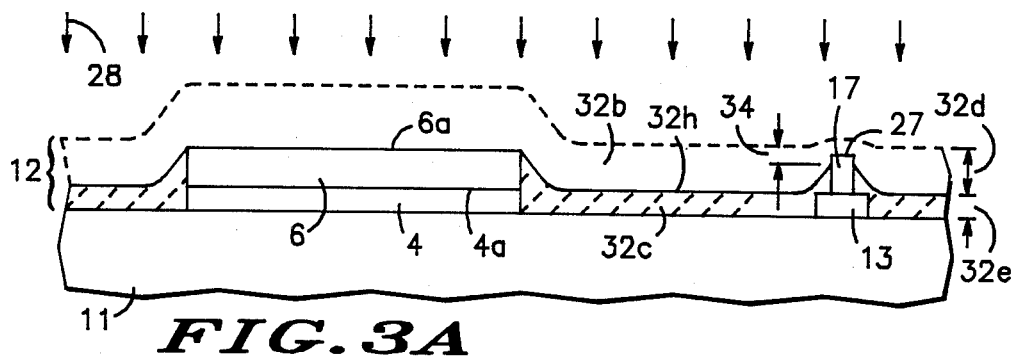
FIGS. 3A–B are cross-sections similar to FIGS. 2A–J but showing the effects of alternative methods of fabrication.
Figure 3B:
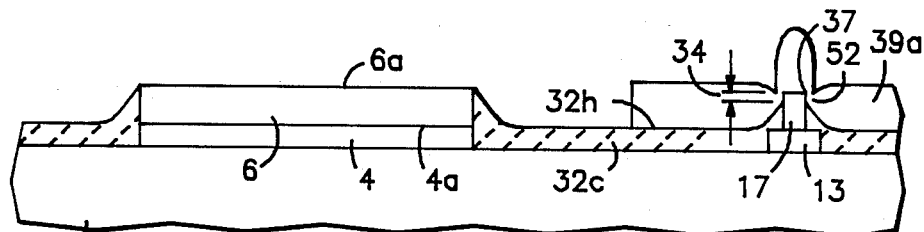
Figure 6:
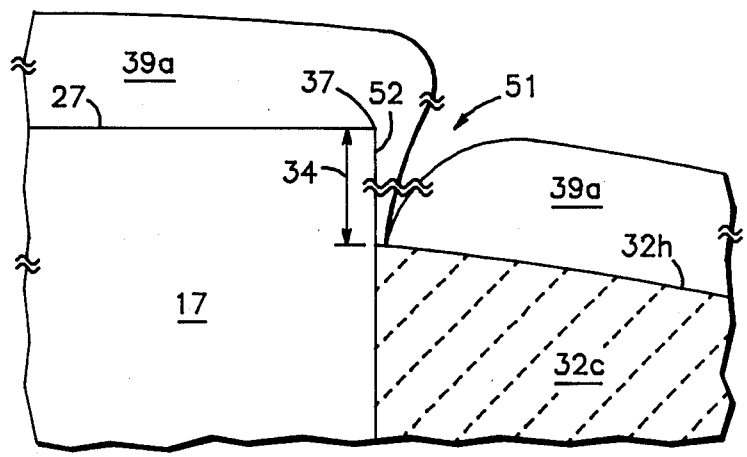
FIG. 6 is a cross-section, much enlarged, of a portion of FIG. 3B at the edge of a pillar.

Before the next layer of interconnect metal can be applied, upper surface 27 of pillar 17 must be exposed. Portion 12b of layer 12 having thickness 12d at least equal to thickness 24 must be removed to exposed surface 27 of pillar 17. This is conveniently accomplished using a uniform anisotropic etching means (e.g., reactive ion etching), as illustrated by ions 28 in FIGS. 2G and 3A. However, a problem arises when it is desired to expose not only surface 27 of pillar 17 but also surface 6a (or 4a) of bonding pad 4, 6. If uniform anisotropic etching is used, such as by ions 28 in FIG. 3A, then portion 32b of layer 12 having thickness 32d at least equal to thickness 25 must be removed in order to expose surface 6a (or 4a). Since thickness 25 is generally significantly larger than thickness 24, due to the area effect found in planarizing layers, remaining portion 32c of dielectric layer 12 around pillar 17 is badly overetched so that surface 32h of portion 32c of layer 12, and surface 27 of pillar 17 are not smoothly joined. Sharp step 52 is created where dielectric 12 meets pillar 17, e.g. at corner 37, as illustrated in FIG. 3B and FIG. 6. Sharp step 52 leads to substantial non-uniformities or discontinuities in second metal layer 39a, as illustrated FIGS. 3B and 6. FIG. 6 shows the portion of FIG. 3B near corner 37 of pillar 17 greatly enlarged and illustrates the formation of crevice 51 in upper conductor 39a at corner 37. Discontinuities such as crevice 51 frequently occur when the upper metallization layer must cross over sharp surface step 52 of substantial height, e.g. more than a few tenths of a micron. A further problem with the structure of FIG. 3B (and FIG. 6) is that remaining dielectric 32c is usually too thin to provide adequate isolation between the superposed conductors where vias are not desired, e.g. at crossovers.

Figure 2F:
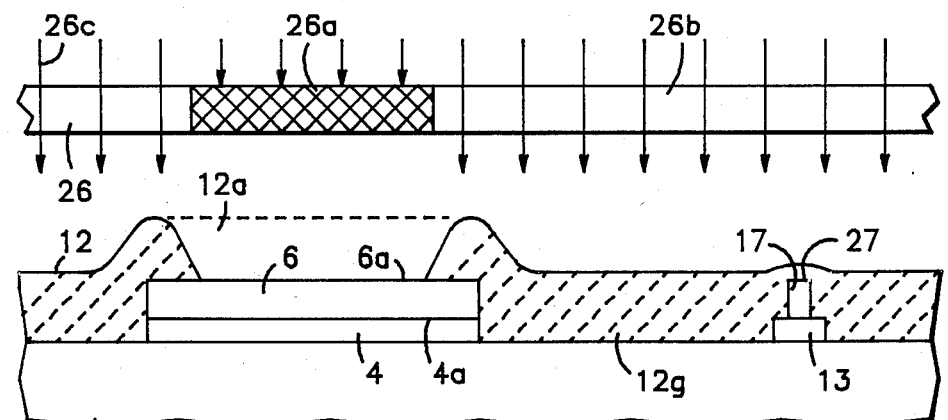

These problems may be avoided according to the method of the present invention illustrated in FIG. 2F and following. Prior to the anisotropic etch to remove thickness 24 of dielectric layer 12 above column 17, mask 26 having first region 26a and second region 26b is placed above substrate 11 and dielectric layer 12 (FIG. 2F). If dielectric layer 12 is a negative acting radiation sensitive material, then region 26a should be opaque and region 26b should be clear. This is the situation illustrated in FIG. 2F. When radiation rays 26c are provided, portion 12a of dielectric layer 12 underneath opaque region 26a remains unaffected while portion 12g exposed to radiation 26c through clear areas 26b of mask 26 is polymerized or otherwise rendered insoluble in developer. When a positive acting material is used, region 26a would be clear and region 26b would be opaque and the opposite reaction occurs. In either case portion 12a of layer 12 is rendered soluble in developer while the remainder is insoluble.

Figure 5:
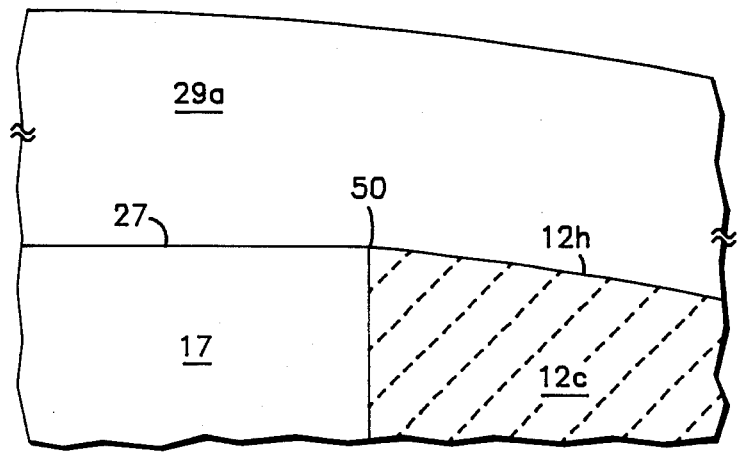
FIG. 5 is a cross-section, much enlarged, of a portion of FIG. 2I at the edge of a pillar.

Following the masking operation, portion 12a of dielectric layer 12 is removed to expose surface 6a (or 4a) of bonding pad 4, 6, as shown in FIG. 2F. Anisotropic etch means 28 is then used to remove portion 12b of thickness 12d at least equal to thickness 24 so that surface 27 of pillar 17 is exposed, leaving behind portion 12c of dielectric layer 12. Since layer 12 is a planarizing layer it is smoothly contoured near the top of pillar 17. Then, after the etch-back of layer 12, upper surface 12h of layer 12 and upper surface 27 of pillar 17 smoothly join without significant steps or cracks. This is illustrated in FIG. 5 which shows the portion of FIG. 2I near corner 50 of pillar 17 greatly enlarged.

It is desirable to stop the etching of dielectric 12 as soon as surface 27 of pillar 17 is reached since overetching of dielectric 12 will produce a step where dielectric 12 and pillar 17 meet. In order to avoid step coverage problems in upper metallization layer 29, overetching of layer 12 and any step-up between surfaces 12h and 27 at corner 50 should be limited to about 0.1 micron or less.

Figure 2H:
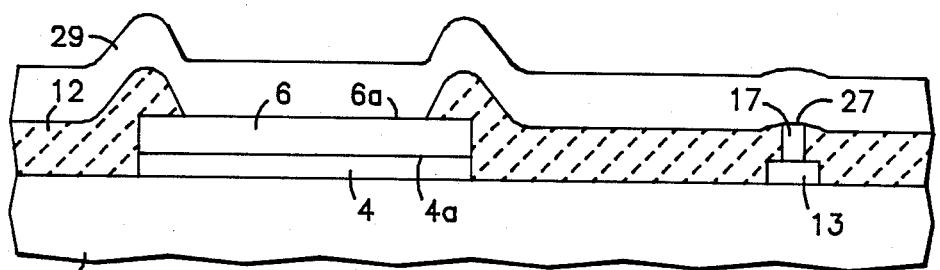
Figure 2I:
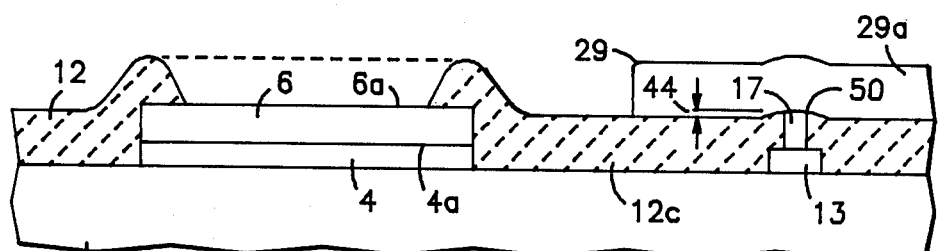
Figure 2J:
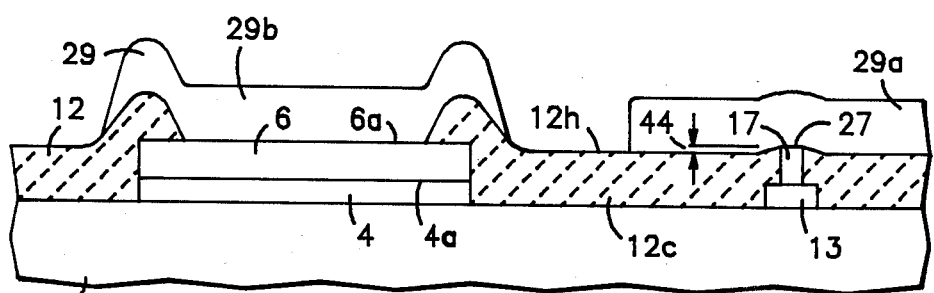

Upper metallization layer 29 is then applied as indicated in FIG. 2H, and patterned as shown in FIGS. 2I or J to provide upper interconnect 29a. In FIG. 2I that portion of layer 29 lying above bonding pad 4, 6 is removed so that surface 6a (or 4a) is exposed and available for bonding. In FIG. 2J, portion 29b of layer 29 is left in place above surface 6a (or 4a). Either arrangement is useful and the choice may be made on the basis of whether the material of regions 4, 6 or 29b is more suitable for bonding.

Figure 4A:
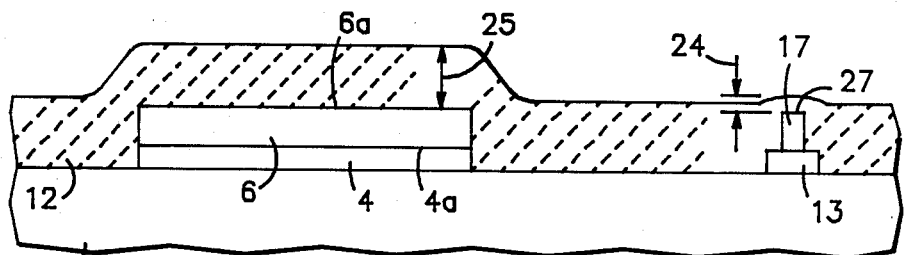
FIGS. 4A–F are cross-sections similar to FIGS. 2A–J, but according to an alternative embodiment of the invention.
Figure 4B:
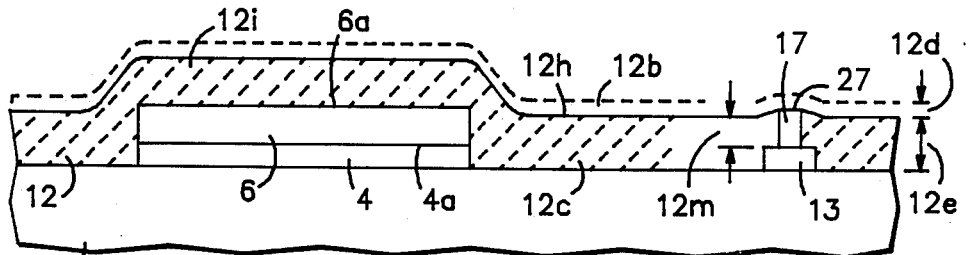
Figure 4C:
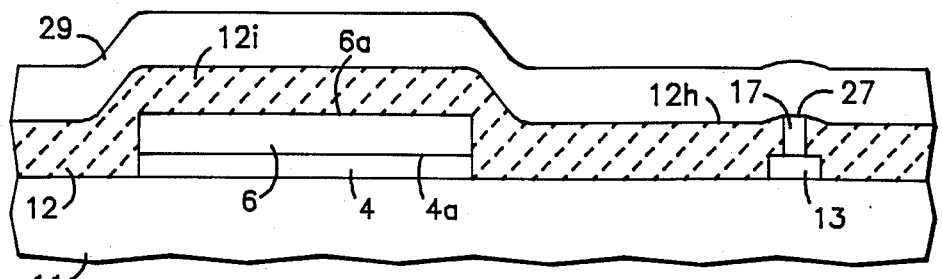
Figure 4D:
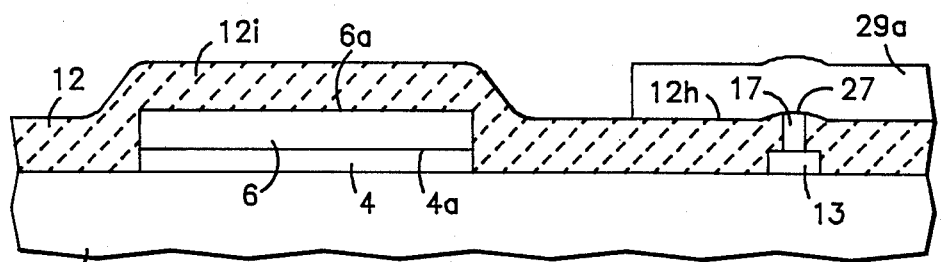

FIGS. 4A–F are cross-sections similar to FIGS 2A–J, at different stages of fabrication, according to a further embodiment of the present invention. FIG. 4A corresponds to FIG. 2E and the steps illustrated and described in connection with FIGS. 2A–E are followed in order to arrive at the structure of FIG. 4A. The structure of FIG. 4A is uniformly etched in FIG. 4B in order to remove portion 12b of thickness 12d of layer 12 so as to expose surface 27 of pillar 17. This may be accomplished by the same methods described in connection with FIG. 2G or by other means. Portion 12c of layer 12 remains over substrate 11 and first interconnect 13, and portion 12i of layer 12 remains over bonding pad 4, 6. The structure of FIG. 4B is then covered by upper metal layer 29, as in FIG. 4C. Upper metal layer 29 is then patterned using means well known in the art to delineate upper interconnect 29a, as shown in FIG. 4D.

Figure 4E:
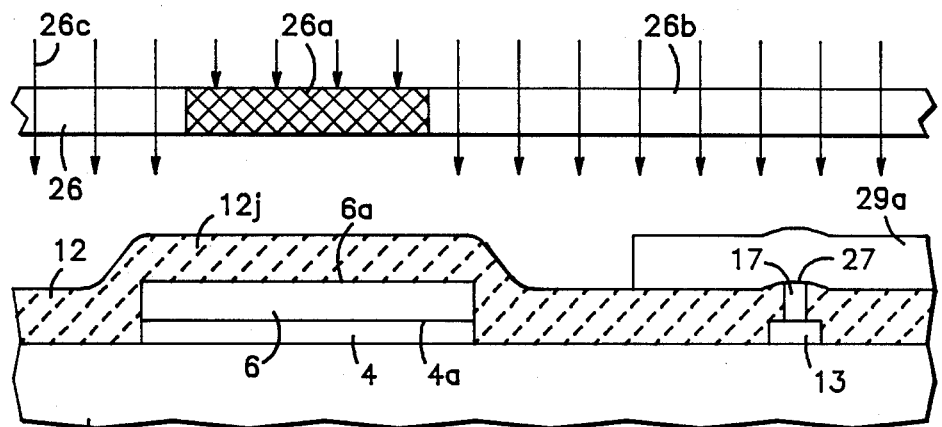
Figure 4F:
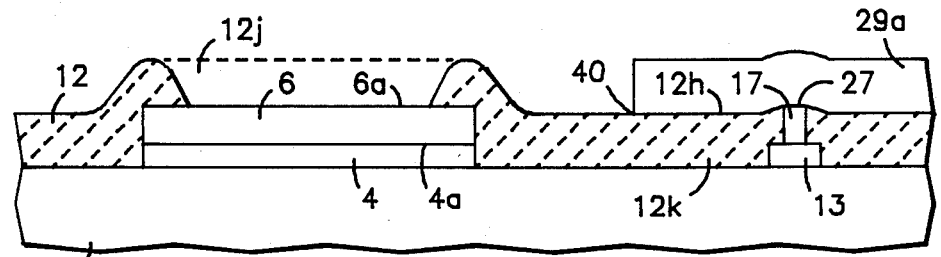

The same masking procedure as was used in connection with FIG. 2F is then used in FIGS. 4E–F to remove portion 12j of layer 12 to expose upper surface 6a (or 4a) of bonding pad 4, 6. Where layer 12 is formed of a negative acting radiation sensitive material this is readily accomplished using mask 26 having region 26a opaque and region 26b clear, in connection with radiation 26c, as illustrated in FIG. 4E. Where layer 12 is formed of a positive acting radiation sensitive material region 26a would be clear and 26b would be opaque. Following exposure through mask 26, soluble portion 12j of layer 12 underneath region 26a of mask 26 is removed by development. Portion 12j of FIG. 4F or 12a of FIG. 2F could alternatively be removed using an additional masking layer rather than employing a radiation sensitive material for layer 12. However, this requires an additional processing step and is less desirable.

The sequence of steps illustrated in FIGS. 2F–I have an advantage compared to the sequence illustrated in FIGS. 4A–F in that during the sequence of FIGS. 2F–I the radiation polymerization (or de-polymerization) step of FIG. 2F occurs before any additional layers are applied over dielectric layer 12. This insures that all parts of layer 12 except portion 12a are rendered insoluble in the developer. This is to be compared with the situation in FIG. 4E wherein portion 12k of layer 12 is shadowed by upper interconnect region 29a and therefore unlikely to be rendered insoluble by radiation 26c. Thus, greater care must be exercised during the development step for removing portion 12j in FIG. 4F so as not to produce undercut etching of region 12k at edge 40 of upper interconnect region 29a. Thus, the process illustrated in FIGS. 2F–I is more tolerant of variations in development time than the process of FIGS. 4A–F. However, either process can be used provided dielectric layer 12 remains unaltered by the metal deposition and etching processes. A further complication is that metal sputtering, plasma etching, and reactive ion etching procedures generate a great deal of UV light and heat that may polymerize or depolymerize all or a portion of dielectric layer 12, or otherwise adversely affect its usefulness as a masking layer. These problems are avoided by the process sequence of FIGS. 2F–I.

EXAMPLE

Layer 12 must be a dielectric layer since it separates lower interconnect 13 and upper interconnect 29a. It must also have planarizing characteristics so that thickness 24 above pillar 17 is less than thickness 23 above substrate 11 and so that it provides a smoothly contoured surface flowing over the various steps in the underlying layers. Type PSPI polyimide manufactured by DuPont of Wilmington, Del. has been found to be a suitable planarizing dielectric. It is also a negative acting photo-sensitive material.

Conductor layer 13a (FIG. 2A) is conveniently of Al-Si or Al-Cu-Si alloy with a thickness in the range of 0.6 to 0.8 microns. Layer 13a is be applied, for example by sputtering, and patterned into regions 13 and 4 by means well known in the art. Structures were built having interconnects 13 typically four microns wide and bonding pad regions 4, 6 typically 100 by 100 microns in lateral extent.

Intermediate conductor layer 17a is conveniently formed of Al-Si or Al-Cu-Si. Structures were built having layer 17a of a thickness in the range of 1.0 to 1.2 microns. Layer 17a was applied by sputter deposition or other means well known in the art and was patterned using conventional techniques to form pillars 17 having lateral dimensions in the range 1.8 to 2.2 by 1.8 to 2.2 microns.

Dupont type PSPI polyimide was diluted with N-Methyl-2-Pyrrolidone and applied to substrate 11 by spinning and then cured according to the manufacturer's instructions to form layer 12. Other means and materials can also be used. Thickness 23 after curing was typically in the range 1.5 to 1.8 microns and thicknesses 24 and 25, were in the ranges 0.5 to 0.7 microns and 1.4 to 1.7 microns, respectively, when used over layers 13a and 17a of the thicknesses described above.

In order to expose surface 27 of pillar 17, as illustrated in FIGS. 2G and 4B, approximately 0.5 to 0.7 microns of layer 12 must be removed. Etching is stopped when surface 27 of pillar 17 is exposed, or as soon thereafter as is practicable, so that surface 12h of remaining portion 12c of layer 12 joins surface 27 of pillar 17 as smoothly as possible with little or no step. Thickness 12e of layer 12 which remains over substrate 11 and thickness 12m which remains over first interconnect 13 are then in the range 0.8 to 1.3 microns. These thicknesses have been found to be sufficient to provide adequate electrical isolation between overlying conductors where they are not intended to be connected by a via and pillar.

Where bonding pad 4, 6 has lateral dimensions of the order of 100 by 100 microns it has been found that, for the layer thicknesses described above, thickness 25 is in the range 1.4 to 1.7 microns after curing. If this thickness of material was removed from layer 12, as illustrated in FIGS. 3A–B, in order to expose surface 27 of pillar 17 and surface 6a of bonding pad 4, 6 at the same time, then the resulting multi-layer structure would have step 52 of height 34 (FIG. 3B) between surface 32h of dielectric portion 32c and surface 27 of pillar 17 in the range 0.9 to 1.0 microns. This is illustrated in more detail in FIG. 6. This situation is to be compared to that in FIGS. 2I and 5 where surfaces 12h and 27 smoothly join.

It is the local smoothness of the joint rather than the absolute flatness of the two surfaces which is important. Thus, even though surfaces 12h and 27 have a difference in absolute flatness of about 0.5–0.9 microns (FIGS. 2I–J), measured as difference 44 in average elevation far from corner 50, locally at corner 50 they still meet smoothly, as shown in FIG. 5. It has been found that where surfaces 12h and 27 join with differences in local elevation of about a tenth micron or less, that layer 29 and upper interconnect 29a may be formed and delineated without significant step coverage problems. Thus, for good multi-layer metal coverage, pillar 17 and surface 12h of dielectric layer 12 (FIGS. 2I and 5) should meet within about a tenth micron.

It is desirable that layers 17a and 13a be differentially etchable, so that layer 17a can be etched by reagents which do not substantially attack the material of layer 13a or which attack the material of layer 13a at a much slower rate. This permits the process of delineating layer 17a in order to form pillar 17 and upper bonding pad region 6 to be self-limiting, i.e. etching stops automatically when underlying conductors 4, 13 are reached. This is especially convenient. Aluminum and titanium-tungsten are an example of a pair of differentially etchable conductor materials. Other pairs are known and can also be used.

While the invention has been illustrated in terms of particular structures, those of skill in the art will understand that the methods taught herein also apply to other devices, circuits, and structures. In particular, it will be appreciated that substrate 11 may consist of a semiconductor or other material and may have various insulating and/or conductor layers on its surface in addition to those described herein. It will also be appreciated that even though only two layers of metallization have been illustrated herein, the methods described may be utilized to produce multi-layer metallization arrangements having three or four or more layers. The smoothness of the upper surface of each successive layer is determined by the smoothness of the underlying layers in combination with the planarizing action of dielectric interlayer 12. It will also be appreciated that although exposure of photosensitive layer 12 has been illustrated as using light rays 26c through optical mask 26, that layer 12 could also be an electron sensitive or x-ray sensitive material where rays 26c are, respectively electrons or x-rays, and mask 26 is the appropriate means, well known in the art, for controlling such radiation. As used herein the word "radiation" is intended to include light, x-rays, electrons, and other forms of ionizing or polymerizing radiation.

In addition, the techniques described herein are useful for other types of electronic devices fabricated using planar technology and requiring multiple layers of conductors such as, but not limited to, SOS devices and circuits, bubble devices and circuits, Josephson devices and circuits, and semiconductor integrated circuits. Accordingly, it is intended to include all such variations in the claims which follow.

I claim:

1. A process for forming multi-layer conductors connected by conductive pillars, comprising:
   providing a substrate;
   applying a first conductor layer on said substrate, wherein said first conductor layer includes a first interconnect region and a bonding region;
   forming a conductive pillar on said first interconnect region;
   coating said substrate, bonding region, and pillar with a dielectric planarizing layer having a first thickness over said substrate, a second thickness over said bonding region, and a third thickness over said pillar, wherein said third thickness is less than said first and second thicknesses;

removing a portion of said planarizing layer to expose a central part of said bonding region while leaving said first interconnect region and said pillar covered;

uniformly etching said planarizing layer to expose an upper surface of said pillar; and applying a second conductive layer over said remaining planarizing layer and in contact with said upper surface of said pillar.

2. The process of claim 1 wherein said planarizing layer is a radiation sensitive dielectric material and wherein said removing step comprises exposing said radiation sensitive planarizing dielectric layer through a mask which is adapted to render the portion of said radiation sensitive dielectric material layer above said central part of said bonding region soluble in a developer, and then developing said radiation sensitive dielectric material to remove the said soluble portion.

3. The process of claim 2 wherein said radiation sensitive material comprises a polyimide containing material and wherein said removing step further comprises, after said developing step, heating said radiation sensitive polyimide containing material to cure said material.

4. The process of claim 1 wherein said first forming step comprises applying an intermediate conductor layer on said first conductor layer, removing a first portion of said intermediate layer to leave a second portion of said intermediate layer on said interconnect region to form said pillar.

5. The process of claim 4 wherein said step of removing a first portion of said intermediate layer to leave a second portion on said interconnect region comprises leaving a third portion of said intermediate layer on said bonding region.

6. The process of claim 4 wherein said intermediate conductor layer comprises a material which is differentially etchable with respect to said first conductor layer.

7. A process for forming multi-layer interconnects for electronic devices having bonding pads, comprising:

providing a substrate containing electronic devices;

applying and patterning a first interconnect layer for interconnecting some of said devices and forming at least one bonding pad for an external connection;

providing an intermediate conductor layer above said first interconnect layer;

removing a first portion of said intermediate conductor layer to leave a pillar above a first portion of said first interconnect layer;

covering portions of said substrate, said pillar, and portions of said first interconnect layer including said bonding pad with a dielectric planarizing layer having a first thickness above said pillar which is less than second and third thicknesses above, respectively, said substrate and said bonding pad;

removing a portion of said dielectric planarizing layer above said bonding pad, while leaving said first thickness substantially undisturbed;

then, without masking, etching said dielectric planarizing layer to expose the upper surface of said pillar while leaving portions of said first interconnect layer not under said bonding pad and said pillar still covered by remaining portions of said dielectric planarizing layer; and thereafter applying and patterning a second interconnect layer in contact with said upper surface of said pillar and lying on said remaining portions of said dielectric planarizing layer.

8. The process of claim 8 wherein said intermediate layer is of a material which is differentially etchable with respect to said first interconnect layer.

9. The process of claim 8 wherein said step of removing a first portion of said intermediate layer comprises leaving a second portion of said intermediate layer on said bonding pad.

10. The process of claim 8 wherein said dielectric planarizing layer is a negative active radiation polymerizable layer.

* * * * *